United States Patent
Schweitzer, III et al.

(10) Patent No.: US 11,038,342 B2
(45) Date of Patent: Jun. 15, 2021

(54) TRAVELING WAVE IDENTIFICATION USING DISTORTIONS FOR ELECTRIC POWER SYSTEM PROTECTION

(71) Applicant: Schweitzer Engineering Laboratories, Inc., Pullman, WA (US)

(72) Inventors: Edmund O. Schweitzer, III, Pullman, WA (US); Bogdan Z. Kasztenny, Markham (CA)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 257 days.

(21) Appl. No.: 16/137,330

(22) Filed: Sep. 20, 2018

(65) Prior Publication Data
US 2019/0094290 A1    Mar. 28, 2019

Related U.S. Application Data

(60) Provisional application No. 62/562,274, filed on Sep. 22, 2017.

(51) Int. Cl.
*G01R 31/11* (2006.01)
*H02H 7/26* (2006.01)
(Continued)

(52) U.S. Cl.
CPC ......... *H02H 7/265* (2013.01); *G01R 19/2513* (2013.01); *G01R 31/11* (2013.01); *H02H 1/0007* (2013.01); *G01R 31/085* (2013.01)

(58) Field of Classification Search
CPC .. G01R 31/11; G01R 31/085; G01R 19/2513; H02H 1/0007; H02H 7/265
See application file for complete search history.

(56) References Cited

U.S. PATENT DOCUMENTS

| | | | |
|---|---|---|---|
| 2,209,810 A | 7/1940 | Cordroy | |
| 3,401,304 A | 9/1968 | Woodworth | |

(Continued)

FOREIGN PATENT DOCUMENTS

| | | |
|---|---|---|
| CN | 103884963 | 6/2014 |
| CN | 104730419 | 6/2015 |

(Continued)

OTHER PUBLICATIONS

PCT/US2018/052207 Patent Cooperation Treaty International Search Report and Written Opinion of the International Searching Authority, dated Dec. 10, 2018.

(Continued)

*Primary Examiner* — Alex Torres-Rivera
*Assistant Examiner* — Trinh Q Dang
(74) *Attorney, Agent, or Firm* — Jared L. Cherry; Richard M. Edge

(57) ABSTRACT

The present disclosure pertains to systems and methods for analyzing traveling waves in an electric power delivery system. In one embodiment, a system may comprise a traveling wave identification subsystem to receive electric power system signals and identify a plurality of incident, reflected, and transmitted traveling waves. A first traveling wave may be selected from the incident and transmitted traveling waves, and a first distortion may be determined. A second traveling wave subsequent to the first traveling wave, may selected from the incident traveling waves and a second distortion may be determined. A traveling wave analysis subsystem may compare the first distortion and the second distortion and determine whether the first distortion is consistent with the second distortion. A protective action subsystem may implement a protective action based on a first determination that the first distortion is consistent with the second distortion.

20 Claims, 7 Drawing Sheets

(51) Int. Cl.
*H02H 1/00* (2006.01)
*G01R 31/08* (2020.01)
*G01R 19/25* (2006.01)

(56) References Cited

U.S. PATENT DOCUMENTS

| | | | |
|---|---|---|---|
| 3,546,534 | A | 12/1970 | Kotos |
| 3,558,984 | A | 1/1971 | Smith |
| 3,684,948 | A | 8/1972 | Eissmann |
| 3,870,926 | A | 3/1975 | Hughes |
| 4,322,768 | A | 3/1982 | Maeda |
| 4,327,390 | A | 4/1982 | Despiney |
| 4,329,638 | A | 5/1982 | Le Maguet |
| 4,757,263 | A | 7/1988 | Cummings |
| 4,914,382 | A | 4/1990 | Douville |
| 5,272,439 | A | 12/1993 | Mashikian |
| 5,367,426 | A | 11/1994 | Schweitzer, III |
| 5,418,776 | A | 5/1995 | Purkey |
| 5,430,599 | A | 7/1995 | Charpentier |
| 5,473,244 | A | 12/1995 | Libove |
| 5,563,459 | A | 10/1996 | Kurosawa et al. |
| 5,627,415 | A | 5/1997 | Charpentier |
| 5,671,112 | A | 9/1997 | Hu |
| 5,703,745 | A | 12/1997 | Roberts |
| 5,805,395 | A | 9/1998 | Hu |
| 5,991,177 | A | 11/1999 | Kaczkowski |
| 6,028,754 | A | 2/2000 | Guzman |
| 6,256,592 | B1 | 7/2001 | Roberts |
| 6,341,055 | B1 | 1/2002 | Guzman-Casillas |
| 6,356,421 | B1 | 3/2002 | Guzman-Casillas |
| 6,369,996 | B1 | 4/2002 | Bo |
| 6,392,390 | B1 | 5/2002 | Ito et al. |
| 6,456,947 | B1 | 9/2002 | Adamiak |
| 6,493,203 | B1 | 12/2002 | Ito et al. |
| 6,518,767 | B1 | 2/2003 | Roberts |
| 6,571,182 | B2 | 5/2003 | Adamiak |
| 6,590,397 | B2 | 7/2003 | Roberts |
| 6,798,211 | B1 | 9/2004 | Rockwell |
| 6,879,917 | B2 | 4/2005 | Turner |
| 6,919,717 | B2 | 7/2005 | Ghassemi |
| 7,095,139 | B2 | 8/2006 | Tsutada et al. |
| 7,345,863 | B2 | 3/2008 | Fischer |
| 7,425,778 | B2 | 9/2008 | Labuschagne |
| 7,469,190 | B2 | 12/2008 | Bickel |
| 7,472,026 | B2 | 12/2008 | Premerlani |
| 7,629,786 | B2 | 12/2009 | Lee |
| 7,696,648 | B2 | 4/2010 | Kinoshita et al. |
| 7,812,615 | B2 | 10/2010 | Gajic |
| 7,982,341 | B2 | 7/2011 | Kinoshita et al. |
| 8,008,810 | B2 | 8/2011 | Kinoshita et al. |
| 8,217,536 | B2 | 7/2012 | Koshizuka et al. |
| 8,289,668 | B2 | 10/2012 | Kasztenny |
| 8,553,379 | B2 | 10/2013 | Kasztenny |
| 8,564,159 | B2 | 10/2013 | Udagawa et al. |
| 8,750,008 | B2 | 6/2014 | Sugiyama et al. |
| 9,008,982 | B2 | 4/2015 | Tziouvaras |
| 9,459,291 | B2 | 10/2016 | Matsumoto |
| 9,714,957 | B2 | 7/2017 | Giovanelli |
| 2001/0012984 | A1 | 8/2001 | Adamiak |
| 2002/0101229 | A1 | 8/2002 | Roberts |
| 2003/0164714 | A1 | 9/2003 | Ghassemi |
| 2005/0068792 | A1 | 3/2005 | Yasumura |
| 2006/0012374 | A1 | 1/2006 | Kojovic |
| 2007/0070565 | A1 | 3/2007 | Benmouyal |
| 2007/0290670 | A1 | 12/2007 | Lee |
| 2008/0077336 | A1 | 3/2008 | Fernandes |
| 2009/0059447 | A1 | 3/2009 | Gajic |
| 2009/0091867 | A1 | 4/2009 | Guzman-Casillas |
| 2009/0097173 | A1 | 4/2009 | Kinoshita et al. |
| 2009/0230974 | A1 | 9/2009 | Kojovic |
| 2010/0002348 | A1 | 1/2010 | Donolo |
| 2010/0039737 | A1 | 2/2010 | Koshizuka et al. |
| 2010/0085668 | A1 | 4/2010 | Kinoshita et al. |
| 2010/0141235 | A1 | 6/2010 | Koshiduka et al. |
| 2010/0217548 | A1 | 8/2010 | Faybisovich |
| 2011/0080053 | A1 | 4/2011 | Urano |
| 2013/0155553 | A1 | 6/2013 | Kawasaki et al. |
| 2013/0176021 | A1 | 7/2013 | Udagawa et al. |
| 2015/0081234 | A1 | 3/2015 | Schweitzer, III et al. |
| 2015/0081235 | A1 | 3/2015 | Schweitzer |
| 2016/0077149 | A1 | 3/2016 | Schweitzer, III |
| 2016/0241336 | A1 | 8/2016 | Kasztenny |
| 2017/0012424 | A1 | 1/2017 | Schweitzer, III et al. |
| 2017/0082675 | A1 | 3/2017 | Schweitzer, III et al. |
| 2017/0110875 | A1 | 4/2017 | Schweitzer, III et al. |
| 2017/0222588 | A1* | 8/2017 | Royak .................... H02P 21/13 |
| 2018/0145665 | A1* | 5/2018 | Hurwitz ................ H03K 4/502 |

FOREIGN PATENT DOCUMENTS

| | | |
|---|---|---|
| CN | 103364604 | 6/2016 |
| CN | 103604991 | 3/2017 |
| EP | 1074849 | 2/2001 |
| WO | 2009081215 | 7/2009 |
| WO | 2016139613 | 9/2016 |
| WO | 2016177407 | 11/2016 |
| WO | 2017125145 | 7/2017 |

OTHER PUBLICATIONS

PCT/US2018/052275 Patent Cooperation Treaty International Search Report and Written Opinion of the International Searching Authority, dated Dec. 7, 2018.

ABB High Voltage Products. "PQ-Sensor™" http://www.pqs-consulting.com/brochure-abb-1hsm_9543_42-20en_pqsensor_technical_information.pdf, Apr. 2008.

Trench, "Master of Waves" https://w5.siemens.com/italy/web/pw/press/newsletterenergy/Documents/Trench_Italia.pdf, Sep. 2014.

Ritz Instrument Transformers. "PQSensor Power Quality Sensor", Apr. 2006.

BVM Systems Limited, "PQSensor™ MkIII Installation and Commissioning Manual", Aug. 2010.

Arteche "Power Quality Measurement with Capacitor Voltage Transformers", Nov. 2013.

BVM Systems Limited, "Harmonic Measurements on Transmission Networks" Sep. 2010.

60HZ Solutions, Corporate Profile, Sep. 2014.

Kai Che, Jinxi Yang, Tanru Ni, Xiangjun Zeng, Yang Leng, Yunkun Xiang, "Testing System of Voltage Traveling Wave Fault Location Technique" 2017 IEEE Conference on Energy Internet and Energy System Integration, Nov. 26-28, 2017.

Zewin Li, Tuofu Deng, Xiangjun Zeng, Feng Deng, Lei Shu, "Theoretical Modeling and Implementation of Traveling Wave Sensor Based on PCB Coils" Journal of Sensors, vol. 2015, Apr. 2, 2015.

T. Yamada, E. Kurosaki, N. Yamamoto, M. Matsumoto, "Development of Simple Coupling-Capacitor Voltage Transformer for GIS" 2001 IEEE Power Engineering Society Winter Meeting, Jan. 28-Feb. 2001.

E. O. Schweitzer, III, B. Kasztenny, "Distance Protection, Why Have we Started with a Circle, Does it Matter, and What Else is Out There?" 44th Annual Western Protective Relay Conference, Oct. 2017.

David Costello, Karl Zimmerman, "CVT Transients Revisited—Distance, Directional Overcurrent, and Communications-Assisted Tripping Concerns" 65th Annual Conference for Protective Relay Engineers, Apr. 2012.

R. A. Hedding "CCVT Transient Fundamentals" 65th Annual Conference for Protective Relay Engineers, 2012.

Y.J. Xia "A Novel Fault Location Scheme Using Voltage Traveling Wave of CVTs" Universities Power Engineering Conference, 2004.

R. G. Bainy, F. V. Lopes, W. L. A. Neves, "Benefits of CCVT Secondary Voltage Compensation on Traveling Wave-Based Fault Locators" PES General Meeting 2014.

F. Ghassemi "Harmonic Voltage Measurements Using CVTs" IEEE Transactions on Power Delivery, vol. 20, No. 1, Jan. 2005.

H. J. Vermeulen, P. Davel, "Voltage Harmonic Distortion Measurements Using Capacitive Votlage Transformers" IEEE Africon, 1996.

(56) References Cited

OTHER PUBLICATIONS

BVM Systems Limited. "PQSensor™ Broadband Voltage Transducer", http://www.bvmsystems.com.uk/Downloads_files/PQSensor_1.0_A4.pdf, Dec. 2009.
F. Ghassemi and P. Gale, "Method to Measure CVT Transfer Function", IEEE Transactions on Power Delivery, vol. 17, No. 4, pp. 915-920, Oct. 2002.
PCT/US2018/052480 Patent Cooperation Treaty, International Search Report and Written Opinion of the International Searching Authority, dated Nov. 26, 2018.
Edmund O. Schweitzer, III, Armando Guzman, Mangapathirao V. Mynam, Veselin Skendzic, Bogdan Kasztenny, Stephen Marx; Locating Faults by the Traveling Waves they Launch, 2014 Texas A&M Conference for Protective Relay Engineers, Feb. 10, 2014.
Yadong Liu, Gehao Sheng, Zhimin He, Xiuchen Jiang, A Traveling Wave Fault Location Method for Earth Faults Based on Mode Propagation Time Delays of Multi-Measuring Points, Przeglad Elektrotechniczny (Electrical Review), Jan. 2012.
PCT/US2018/052204 Patent Cooperation Treaty, International Search Report and Written Opinion of the International Searching Authority, dated Dec. 21, 2018.
PCT/US2018/052196 Patent Cooperation Treaty, International Search Report and Written Opinion of the International Searching Authority, dated Dec. 21, 2018.
PCT/US2018/052470 Patent Cooperation Treaty, International Search Report and Written Opinion of the International Searching Authority, dated Nov. 30, 2018.
J. Brunke, Elimination of Transient Inrush Currents When Energizing Unloaded Power Transformers, Ph.D Dissertation, ETH Swiss Federal Institute of Technology, Zurich, Switzerland, 1998.
D. Goldsworthy, T. Roseburg, D. Tziouvaras, and J. Pope, Controlled Switching of HVAC Circuit Breakers: Application Examples and Benefits, 34th Annual Western Protective Relay Conference Proceedings, Spokane, WA, Oct. 2007.
J. H. Brunke and K. J. Frohlich, Elimination of Transformer Inrush Currents by Controlled Switching, Part II, IEEE Transactions on Power Delivery, vol. 16, No. 2, pp. 281-285, Apr. 2002.
J. H. Brunke and K. J. Frohlich, Elimination of Transformer Inrush Currents by Controlled Switching, IEEE Electric Power Systems Research-Selected Topics in Power System Transients, pp. 642-649, May 2006.
A. Mercier, E. Portales, Y. Filion, and A. Salibi, Transformer Control Switching Taking into Account the Core Residual Flux—a Real Case Study, Paper No. 13-201, Cigre 2002 Session, Paris, France.
E. Portales, and Q. Bui-Van, New Control Strategy of Inrush Transient During Transformer Energization at Toulnustouc Hydropower Plant Using a Double-Break 330 kV Circuit Breaker, IPST 2003, New Orleans, USA.
CIGRE WG 13.07, Controlled Switching of Unloaded Power Transformers, Electra, No. 212, pp. 39-47, Feb. 2004.
M. Steurer and K. Frohlich, The impact of inrush currents on the mechanical stress of high voltage power transformer coils, IEEE Transactions on Power Delivery, vol. 17, No. 1, pp. 155-160, Jan. 2002.
F. Ghassemi and P. Gale, Harmonic voltage measurements using CVTs, IEEE Transactions on Power Delivery, vol. 17, No. 4, pp. 915-920, Oct. 2002.
F. Ghassemi and P. Gale, Method to measure CVT transfer function, IEEE Transactions on Power Delivery, vol. 20, No. 1, pp. 443-449, Jan. 2005.
S. Zhao, H. Y. Li, F. Ghassemi, P. Crossley, Impact of power quality sensor technique on power system protection voltage transient measurements, 10th IET International Conference on Developments in Power System Protection, Mar. 2010.
R. Malewski, J. Douville, and L. Lavalee, Measurement of switching transients in 735 kV substations and assessment of their severity for transformer insulation, IEEE Transactions on Power Delivery, vol. 3, No. 4, pp. 1380-1390, Oct. 1988.

Douglas I. Taylor, Single Phase Transformer Inrush Current Reduction Using Pre-Fluxing, A Thesis Presented in Partial Fulfillment of the Requirement for the Degree of Master of Science with a Major in Electrical Engineering in the College of Graduate Studies, University of Idaho, Nov. 13, 2009.
M. J. Heathcote, The J & P Transformer Book, 12th Edition, Elsevier, 1998, pp. 512-513.
S. G. Abdulsalam, W. Xu, A Sequential Phase Energization Method for Transformer Inrush Current Reduction—Transient Performance and Practical Considerations, IEEE Transactions of Power Delivery, vol. 22, No. 1, Jan. 2007, pp 208-216.
A. Ebner, Determination of Residual Flux for Controlled Transformer Energisation, Power Systems and High Voltage Laboratories Annual Report, 2008, Swiss Federal Institute of Technology, Zurich, Switzerland, pp. 57-61.
V. Molcrette, J.-L. Kotny, J.-P. Swan, J.-F. Brundy, Reduction of Inrush Current in Single-Phase Transformer using Virtual Air Gap Technique, IEEE Transactions on Magnetics, vol. 34, No. 4, pp. 1192-1194, Jul. 1998.
B. Kovan, F. De Leon, D. Czarkowski, Z. Zabar, L. Birenbaum, Mitigation of Inrush Currents in Network Transformers by Reducing the Residual Flux With an Ultra-Low-Frequency Power Source, IEEE Transactions on Power Delivery, vol. 26, No. 3, pp. 1563-1570, Jul. 2011.
ABB, Bushing Potential Device, Type PBA2, Instructions for Installation and Maintenance, Sep. 2003.
T. Liu, H. Siguerdidjane, M. Petit, T. Jung, J.P. Dupraz, Reconstitution of Power transformer's Residual Flux with CVT's Measurement During its De-energization, Sep. 8-10, 2010.
Three Phase Electric Power, available at http://en.wikipedia.org/wiki/three-phase_electric_power on Mar. 2, 2011.
Capacitor Voltage Transformer, available at httP://en.wikipedia.org/wiki/Capacitor_voltage_transformer on Sep. 4, 2010.
Demetrios A. Tziouvaras, Jeff Roberts, and Gabriel Benmouyal, New Multi-Ended Fault Location Design for Two- or Three-Terminal Lines, Nov. 1, 2004.
Gabriel Benmouyal, The Trajectories of Line Current Differential Faults in the Alpha Plane, Sep. 22, 2005.
Debra Carroll, John Dorfner, Tony Lee, Ken Fodero, and Chris Huntly, Resolving Digital Line Current Differential Relay Security and Dependability Problems: A Case History, 29th Annual Western Protective Relay Conference, Spokane Washington, Oct. 22-24, 2002.
Gabriel Benmouyal and Joe B. Mooney, Advanced Sequence Elements for Line Current Differential Protection, Sep. 15, 2006.
GE Industrial Systems, L90 Line Current Differential System, UR Series Instruction Manual, Section 8, Manual P/N:1601-0081-T1(GEK-113488) L90 Revision 5.6x2008, Section 8, Jan. 2008.
PCT/US2010/049162 Patent Cooperation Treaty International Search Report and Written Opinion of the International Searching Authority, dated Dec. 30, 2010.
Bogdan Kasztenny, Ilia Voloh, Eric A. Udren, Rebirth of Phase Comparison Line Protection Principle, 60th Annual Georgia Tech Protective Relaying Conference, Atlanta, Georgia, May 3-5, 2006.
Min Zhang, Xinzhou Dong, Z Q Bo, B R J Caunce, and a Klimek, Simulation Tests of a Novel Criterion for Neutral Current Differential Protection, International Conference on Power System Technology, Sep. 2006 Jeff Roberts, Demetrios Tziouvaras, Gabriel Benmouyal, and Hector J. Altuve, The Effect of Multiprinciple Line Protection on Dependability and Security, Feb. 22, 2001.
Jeff Roberts, Demetrios Tziouvaras, Gabriel Benmouyal, and Hector J. Altuve, The Effect of Multiprinciple Line Protection on Dependability and Security, Feb. 22, 2001.
PCT/US2010/049166 Patent Cooperation Treaty International Search Report and Written Opinion of the International Searching Authority, dated dec. 13, 2010.
U.S. Appl. No. 13/416,978, Non-Final Office Action, dated May 8, 2014.

\* cited by examiner

TRAVELING WAVE IDENTIFICATION USING DISTORTIONS FOR ELECTRIC POWER SYSTEM PROTECTION

RELATED APPLICATION

The present application claims priority under 35 U.S.C. § 119 to U.S. Provisional Patent Application No. 62/562,274, titled TRAVELING WAVE IDENTIFICATION USING DISTORTIONS FOR ELECTRIC POWER SYSTEM PROTECTION filed Sep. 22, 2017, which is incorporated by reference.

TECHNICAL FIELD

This disclosure relates to traveling wave identification using distortions for electric power system protection. This disclosure also relates to determining whether a fault is within a zone of protection using properly identified instances of traveling waves launched by the fault.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Traveling waves ("TWs") are surges of electricity resulting from sudden changes in voltage that propagate at a speed near the speed of light along overhead power lines. When launched by a line fault, these TWs carry information about the fault location and type. Furthermore, this information arrives at the line terminals within 1 to 2 ms depending on the line length and fault location. Relative arrival times and polarities of TWs allow for location of faults with accuracy on the order of a single tower span, as well as to protect the line with a permissive over-reaching transfer trip (POTT) scheme using TW-based directional elements (TW32) and with a TW-based line current differential scheme (TW87). These TW-based line protections utilize a communication channel, which may be either a standard pilot channel for the POTT scheme or a direct fiber-optic channel for the TW87 scheme; and may use current TWs, taking advantage of the adequate frequency response of current measurement devices. In various embodiments, line protection systems consistent with the present disclosure may operate on the order of 1 to 2 ms without a communication channel.

Figure 1:
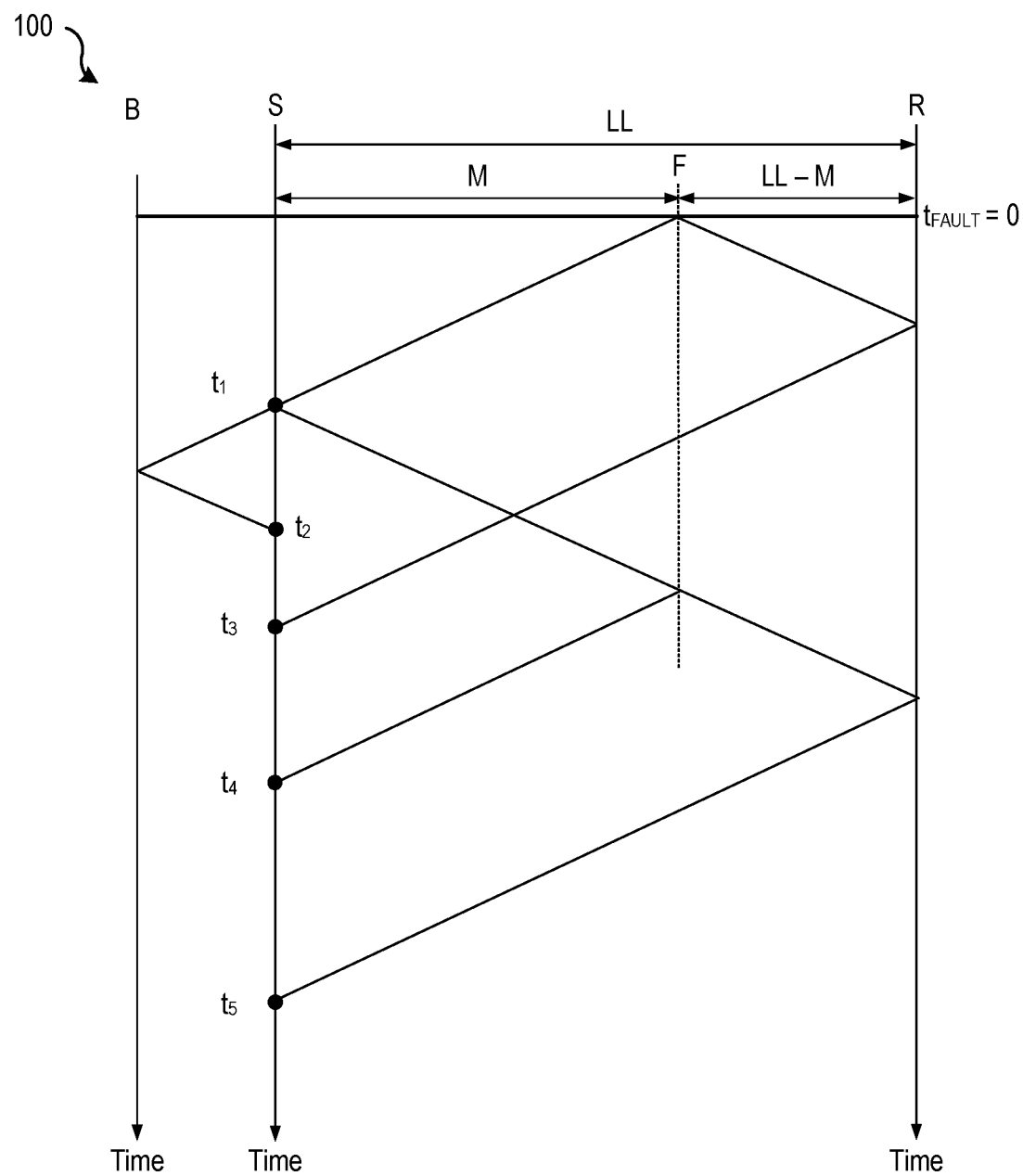
FIG. 1 shows a Bewley diagram for a fault at a location on an electric power system line consistent with embodiments of the present disclosure.

FIG. 1 shows a Bewley diagram for a fault at location F on an electric power system line of length LL consistent with embodiments of the present disclosure. The fault is M (km or mi) away from the local terminal (S) and LL−M (km or mi) away from the remote terminal (R). Consider another terminal (B) behind the local terminal. A TW line propagation time (TWLPT) is the time it takes for a TW to travel from one line terminal to the opposite terminal.

A TW launched at the fault point (F) arrives at the local terminal (S) at $t_1$. Part of the TW reflects, travels back toward the fault, reflects back from the fault, and then returns to the local terminal (S) at $t_4$. During the $t_4-t_1$ time interval, the TW travels a distance of 2·M. We write the distance-velocity-time equation as follows:

$$2 \cdot M = (t_4 - t_1) \cdot PV \qquad \text{Eq. 1}$$

where the propagation velocity, PV, is:

$$PV = \frac{LL}{TWLPT} \qquad \text{Eq. 2}$$

Substituting Eq. 2 into Eq. 1 and solving for M yields Eq. 3, which may be used to calculate the distance-to-fault value:

$$M = \frac{LL}{2} \frac{t_4 - t_1}{TWLPT} \qquad \text{Eq. 3}$$

Introducing a per-unit reach, TW21M, we use Eq. 3 to express an operating equation for the TW21 underreaching distance element:

$$\frac{t_F - t_1}{2 \cdot TWLPT} < TW21M \qquad \text{Eq. 4}$$

where:
$t_1$ is the arrival time of the very first TW, and
$t_F$ is the arrival time of the first return from the fault ($t_4$ in FIG. 1).

To emphasize reliance of the TW21 on the measurement of time, we rewrite the TW21 operating equation as follows:

$$(t_F - t_1) < 2 \cdot TW21M \cdot TWLPT \qquad \text{Eq. 5}$$

The left-hand side of Eq. 5 is the relay measurement. Responding only to TW arrival times, this measurement is not affected by CT and PT ratio errors, transients, and signal distortions in the lower (kHz) frequency band. The TW21 element does not use line impedance data when calculating the operating signal in Eq. 5, and therefore the operating signal is not affected by the finite accuracy of such line data.

The right-hand side of Eq. 5 is a threshold fixed for any given application—twice the product of the line length expressed in the TW line propagation time, TWLPT, and the user-preferred per-unit reach setting, TW21M. When used in the single-ended TW-based fault locator, a fault location may be determined with the accuracy of 1 or 2 tower spans.

Because of this high accuracy, the TW21M reach may be set assertively, such as at 0.95 per unit, to cover 95 percent of the line length without a communication channel (compared with a typical reach setting of 80 percent for an impedance-based distance element).

Figure 2:
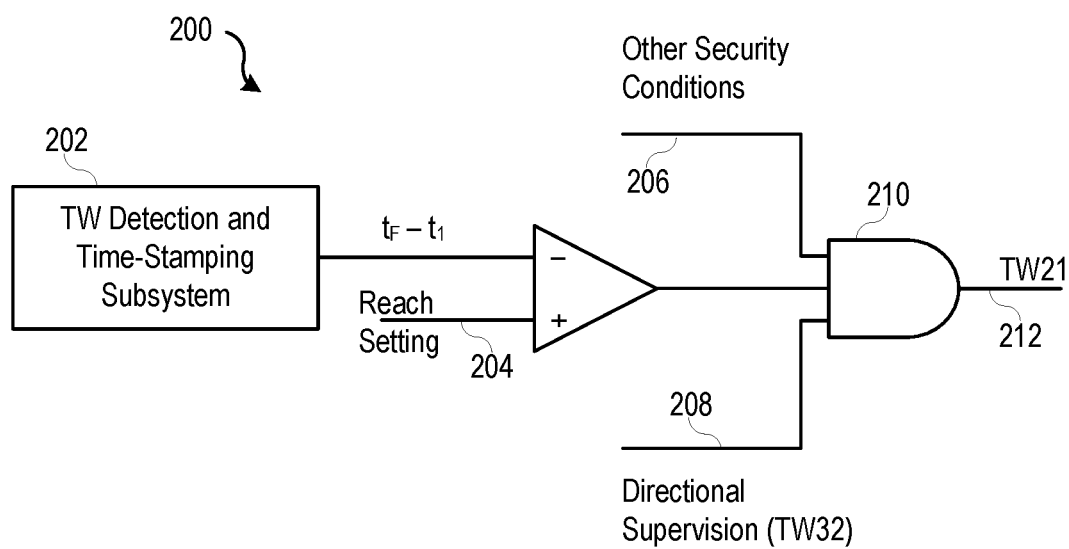
FIG. 2 illustrates a simplified logic diagram of a traveling wave distance element consistent with embodiments of the present disclosure.

FIG. 2 illustrates a simplified logic diagram of a traveling wave distance element 200 consistent with embodiments of the present disclosure. A difference between the arrival time of the first return from the fault ($t_F$) and the arrival time of the first TW associated with the fault ($t_1$) at the terminal ($t_F$-$t_1$) is determined by a TW detection and time-stamping subsystem 202. The difference is representative of a distance to the fault as per Eq. 3. The difference is compared against a reach setting 204. The reach setting 204 may be a setting related to the zone of protection of this particular protection element, such as given by the right-hand side of Eq. 5. If the difference is within the zone of protection (i.e., is less than the reach setting 204), then an output 212 of traveling wave distance element 200 may be asserted. The assertion of the output 212 may be used to apply a protective action such as, for example, tripping to open a line.

According to the illustrated embodiment, the traveling wave distance element 200 may be made more secure by requiring other conditions to exist or be determined before the output 212 is asserted. As illustrated, a directional supervision (TW32) input 208 input may indicate that the fault is in a direction of the TW21 element, typically forward. Furthermore, other security conditions 206 may be required in addition to the directional supervision 208 for the traveling wave distance element 200 to solve challenges related to protection security as described below.

Several challenges remain in a successful implementation of the TW21 element. For example, the distance-to-fault calculation shown in Eq. 3 works well if the element correctly identifies the first return from the fault; however, if another TW is mistaken for the first return from the fault, the calculation of the distance-to-fault calculation will be inaccurate. As illustrated in FIG. 1, the first TW that arrived at $t_1$ continued toward Terminal B, reflected from the terminal, and then returned to the local terminal (S) at time $t_2$. If a TW-based system mistook $t_2$ for the first return from the fault, the distance-to-fault calculation result would be incorrect. Similarly, the first TW that arrived at the remote terminal (R) reflects from Terminal R and returns to the local terminal (S), propagating through the fault point (F). This TW arrives at the local terminal at $t_3$. If the TW21 algorithm mistook $t_3$ for the first return from the fault, the distance-to-fault calculation result would also be incorrect.

Figure 3:
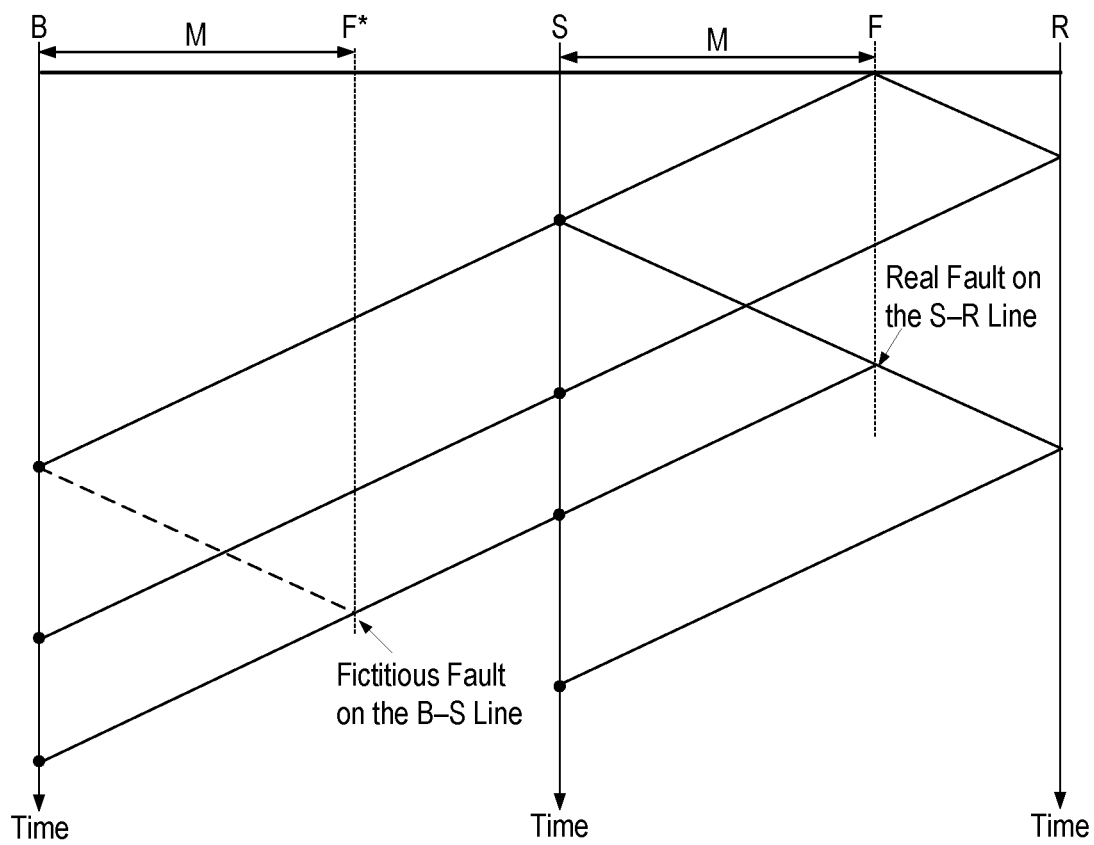
FIG. 3 illustrates a Bewley diagram illustrating a pattern of reflections of a traveling wave at two different terminals consistent with embodiments of the present disclosure.

FIG. 3 illustrates yet another challenge by showing a Bewley diagram illustrating a pattern of reflections of a traveling wave at two different terminals (Terminals S and B) consistent with embodiments of the present disclosure. The fault launches TWs toward both Terminals S and R. These TWs propagate, reflect, and transmit at various discontinuities, and as a result, a train of TWs is measured at Terminal S. Each incident TW that arrived at Terminal S from the direction of the S-R line would partially transmit through Terminal S and arrive at Terminal B. Measuring TWs of the same timing and polarity pattern, a TW21 algorithm at Terminal B would see a fictitious fault location (F*).

The TW21 installed at Terminal S should operate, but the TW21 installed at Terminal B should restrain. Yet, TW21 algorithms at both Terminal B and Terminal S see the same TW timing and polarity pattern. The magnitude of the TWs measured at Terminal B will be lower than the magnitude of TWs measured at Terminal S; however, these low magnitudes may be a result of TW magnitude reduction when transmitting through Terminal S for a fault at F (in which case Terminal B should restrain), or they may be a result of a fault at F* that occurred at the low point-on-wave voltage (in which case Terminal B should operate). Various embodiments disclosed herein may aid in differentiating between a fault at F and F* by using bus-specific TW distortions to identify a return from the fault.

Figure 4:
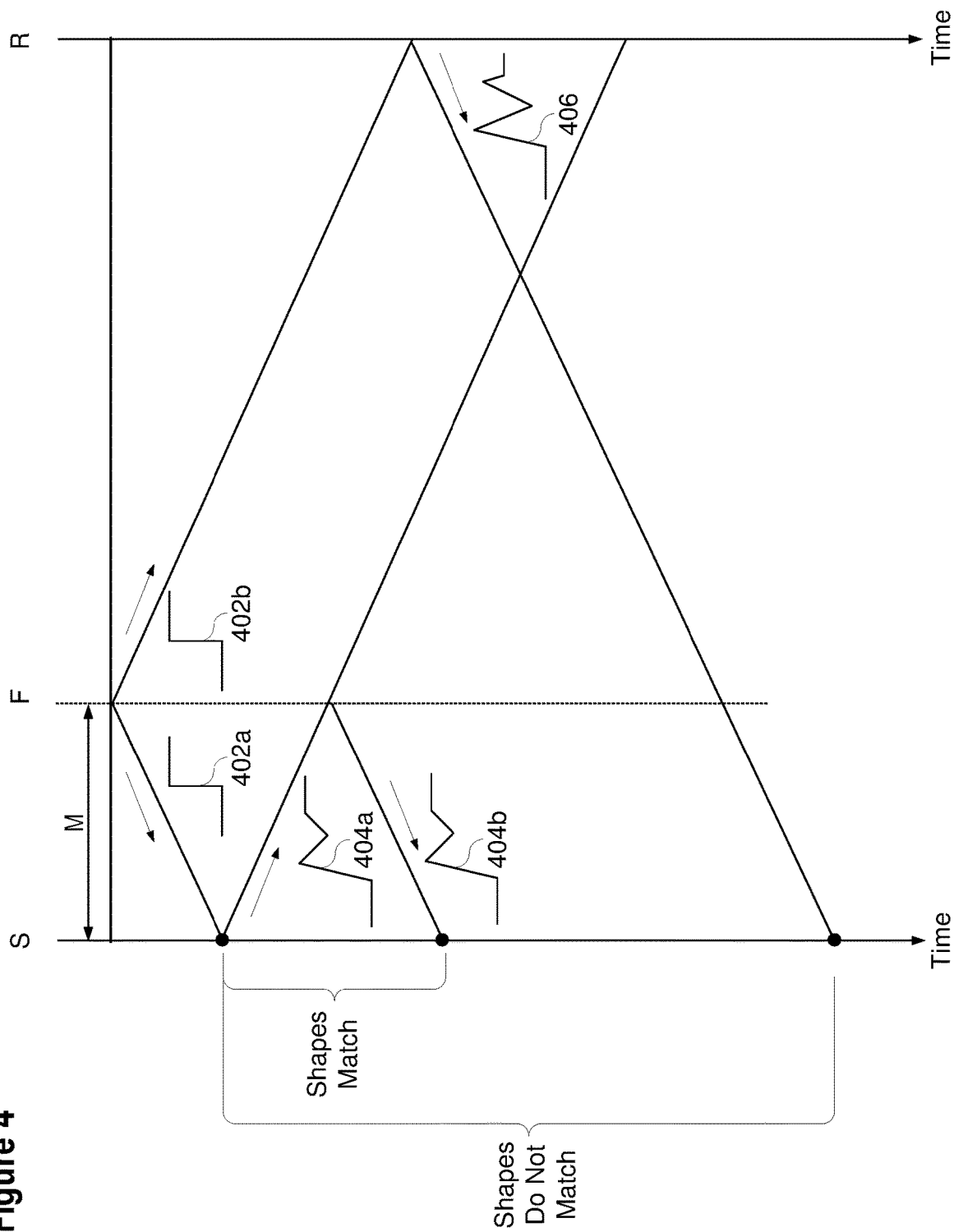
FIG. 4 illustrates a conceptual representation of bus-specific traveling wave distortions overlaid on a Bewley diagram that may be used to identify and distinguish a return from a fault and a return from other reflections consistent with embodiments of the present disclosure.

FIG. 4 illustrates a conceptual representation of bus-specific TW distortions overlaid on a Bewley diagram that may be used to identify and distinguish a return from a fault and a return from other reflections consistent with embodiments of the present disclosure. When a traveling wave arrives at a discontinuity in the characteristic impedance, such as a busbar connecting multiple lines and other power system elements, part of the wave reflects back in the direction of arrival, and part of the wave continues in the original direction. These waves are separately referred to as an incident wave (the wave that arrived at the discontinuity), a reflected wave (the wave that reflected back), and a transmitted wave (the wave that continued in the original direction).

When launched by a fault, the incident TW is a relatively clean step in current and voltage, as indicated by signals 402a and 402b. Signals 402a and 402b propagate toward buses S and R, respectively. When the sharp step in the current and voltage of signals 402a and 402b arrive at buses S and R, the signals excite the parasitic high-frequency resonant circuits present at the buses. The lumped-parameter circuits are composed of the inductance and capacitance of the buswork, parasitic capacitance of transformer windings, capacitance-coupled voltage transformer (CCVTs), surge arresters, and so on. As a result, the reflected TWs are distorted in a way that they "encode" the unique characteristics of the bus. As illustrated, the reflection from bus S 404a differs from the reflection from bus R 406. These uniquely encoded TWs 404a and 406 reflect back from buses S and R toward the fault.

Signal 404a reflects again from fault F without significant distortion (i.e., the unique encoding from the reflection from bus S is retained) as signal 404b. An IED implementing a TW21 algorithm at bus S may compare signals 404a and 404b, determine that the shapes are similar, and thus identify the wave 404b as a reflection from the fault of the wave 404a, and by doing so provide additional security associated with the determination of the distance M to the fault F.

Signal 406 is encoded with the unique shape associated with bus R. When signal 406 arrives at bus S, an IED implementing a TW21 algorithm may determine that the shape of signal 406 differs from the shape of signals 404a. Based on this difference, the algorithm may correctly determine that signal 406 is not a reflection from fault F of the wave 404a, but rather is a reflection from a different bus with a unique encoding. It shall be noted that TWs when they reflect and transmit at various discontinuities, they may change polarity. For simplicity, the explanation above does not consider polarity changes. Similarly, one must consider the three-conductor nature of power lines. A TW in one conductor couples to the other two conductors as it travels. TWs when they reflect and transmit at various discontinuities, they couple anew after reflection or transmission. A practical implementation shall take these observations into account.

In similar manner, TWs that come from behind the relay and are transmitted through the local bus toward the fault on the protected line are also encoded with the circuits present on the bus. If their energy is high enough to travel to the fault and back, they will return with a similar shape. In general, a return from the fault is any incident wave that traveled toward the bus from the forward direction and has a shape similar to the shape of the wave that traveled away from the bus in the forward direction. This principle can be summarized as follows: if the shapes of the TWs sent toward the fault (reflected from the bus after arriving from discontinuities in front of the bus, or transmitted through the bus after originating behind the bus) and the incident TWs arriving after 2·m·TWLPT are similar, then m is a true per-unit distance to the fault.

Figure 5:
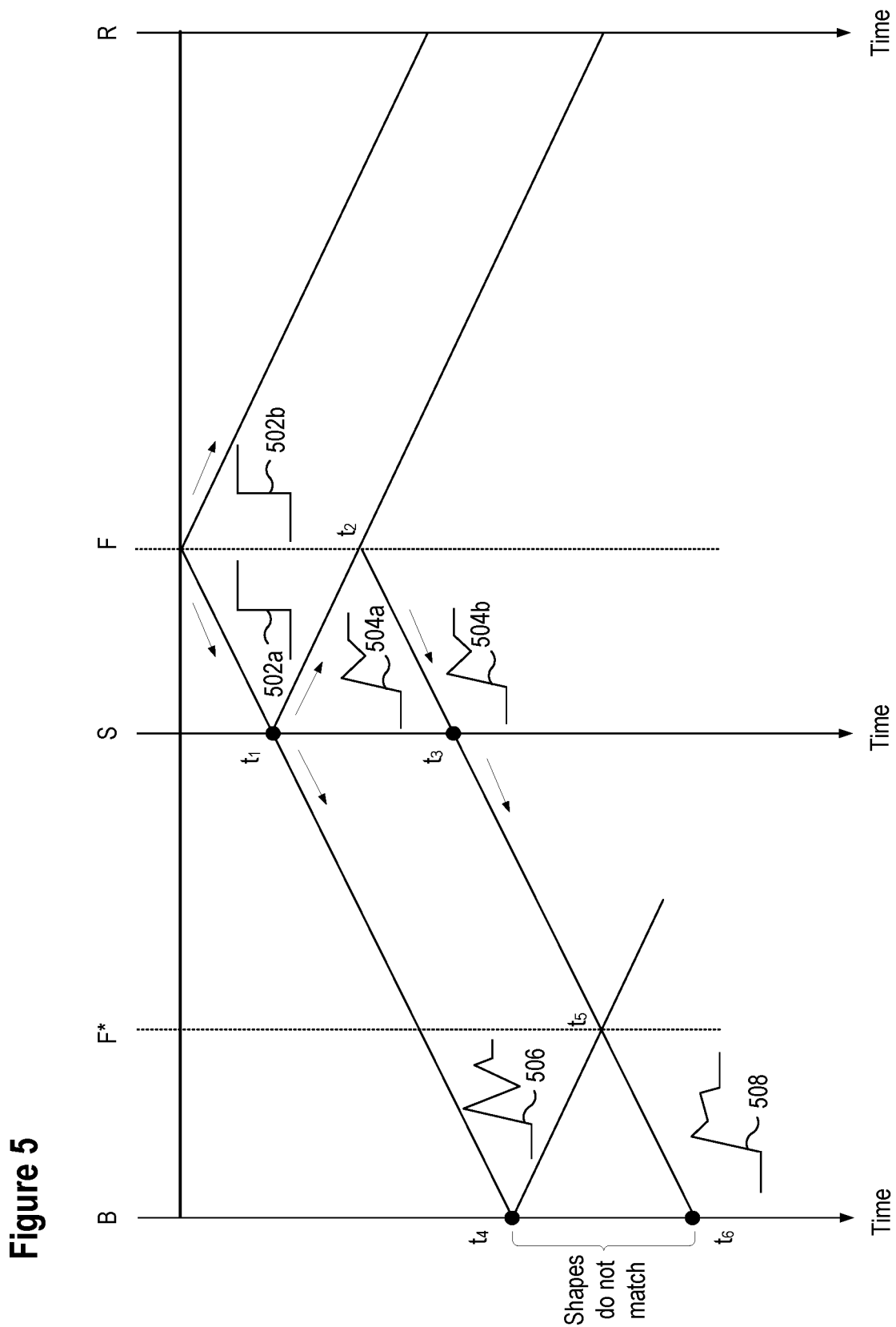
FIG. 5 illustrates a conceptual representation of bus-specific traveling wave distortions overlaid on a Bewley diagram that may be used to identify a distinguish a return from a fault in a system with multiple buses consistent with embodiments of the present disclosure.

FIG. 5 illustrates a conceptual representation of bus-specific TW distortions overlaid on a Bewley diagram that may be used to identify and distinguish a return from a fault in a system with multiple buses consistent with embodiments of the present disclosure. Identification of a return from a fault may allow a relay associated with a faulted line to trip and allow a relay associated with a healthy line to restrain. Signal 502a first encounters bus S at time $t_1$. A portion of signal propagates beyond bus S and arrives at bus B (signal 506), and a portion reflects from bus S (signal 504a) toward the fault F. The reflected signal 504a may be "encoded" with certain unique characteristics of bus S. Signal 504a reflects again from fault F, resulting in signal 504b, which returns to bus S. The reflection of signal 504a from fault F does not introduce significant distortion, and accordingly the shape of signals 504a and 504b match. An IED at bus S receiving signals 504a and 504b may compare the shape of the signals and determine that the shapes match in connection with a TW21 protection system. Based on the determination that the shape of signals 504a and 504b match, an IED at bus S may operate—assuming other conditions match, such as those depicted in FIG. 2—to trip the line and de-energize fault F.

In contrast to the matching signals 504a, 504b at bus S, the signals received by an IED at bus B will not match due to the encoding of these signals resulting from different interactions with bus S and bus B. More specifically, signals 506 and 508 may arrive at bus B at $t_4$ and $t_6$, respectively. Signal 504a comprises an "encoded" reflection of the signal 502a, while signal 504b comprises an "encoded" representation of the signal 502b that passes through bus S. Stated in other words, signal 506 is equal to the difference between signal 502a and 504a. The interaction with the lumped-parameter circuits associated with bus S may cause signal 504a and signal 506 to have differences in shape that may be analyzed by various embodiments consistent with the present disclosure.

An IED analyzing the signals shown in FIG. 5 may recognize the different "encoding" of various signals as a result of reflection from or passing through various buses. Accordingly, an IED may determine that the signal 508 is not a reflection of the signal 506 at $t_4$ of a fault at F*, and that arrives back at bus B at $t_6$. Based on such a determination, the IED at bus B may properly restrain a protective action for the fault at F, which is external to the B-S line that IED protects.

The term "similar shape" used above can be implemented in a number of ways. In one possible implementation, a correlation can be used between short data windows of one wave with a wave suspected to be the return of the first wave reflected from the fault. If the two shapes are similar a correlation would yield a large value relative to product of autocorrelations for each wave.

Figure 6:
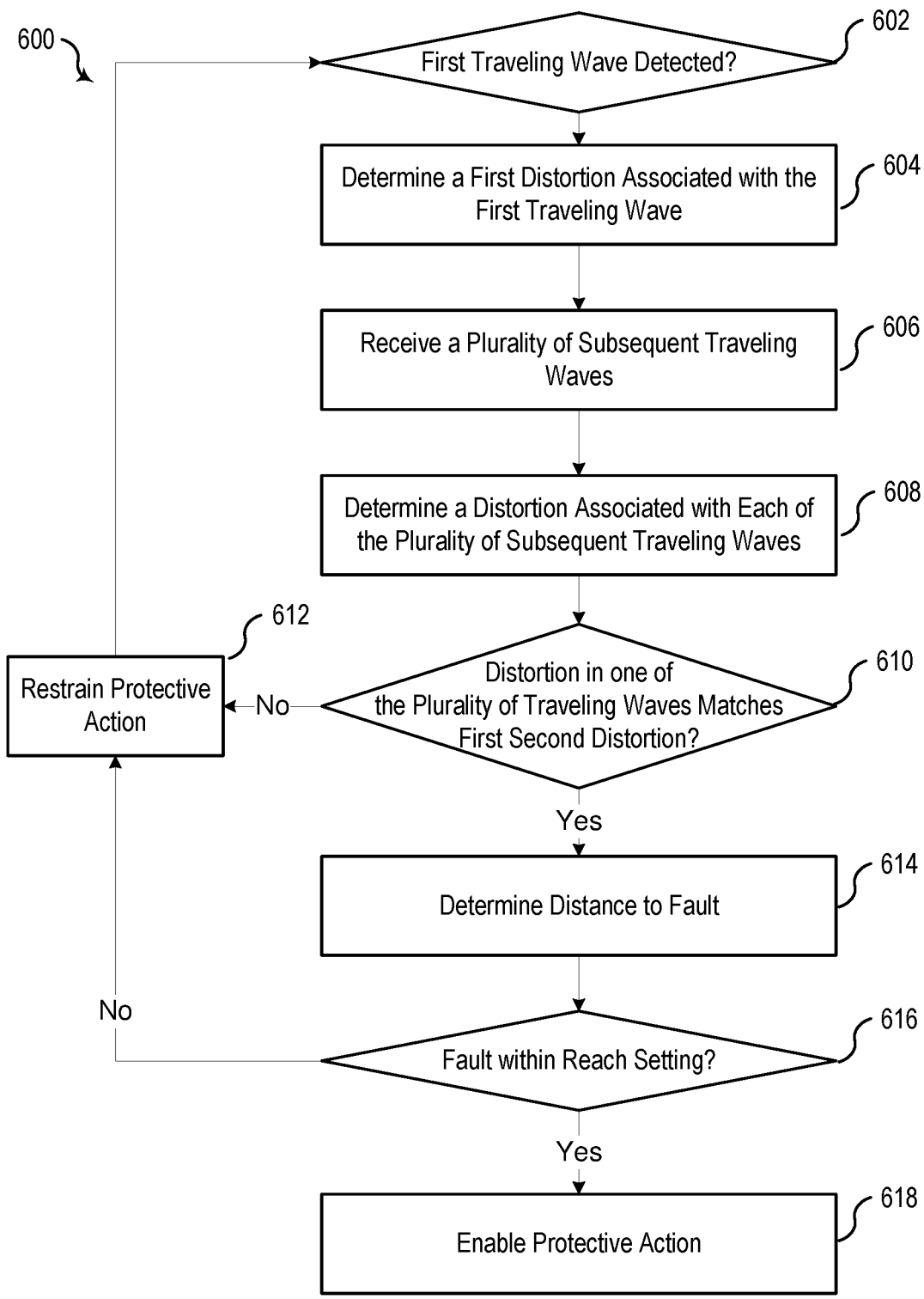
FIG. 6 illustrates a flow chart of a method for identifying traveling waves using distortions in embodiments consistent with the present disclosure.

FIG. 6 illustrates a flow chart of a method 600 for identifying traveling waves using distortions in embodiments consistent with the present disclosure. At 602, method 600 may determine whether a first traveling wave is detected. Upon detection of the first traveling wave at 602, method 600 may determine a first distortion of the first traveling wave at 604. As described above, reflection of a traveling wave from a bus in an electric power system encodes the traveling wave with a unique pattern determined by the electrical characteristics of the bus, such as the inductance and capacitance of the buswork, parasitic capacitance of transformer windings, CCVTs, surge arresters, and so on.

A plurality of traveling waves may be received at 606. The plurality of traveling waves may be created by virtue of reflections from discontinuities within an electric power system. In various embodiments, each reflection may be processed one at a time. The plurality of traveling waves may comprise, for example, a plurality of reflections arriving from both the forward and reverse directions, and some of the reflections coming from the forward direction may be reflections from the fault on the protected line, and each resulting traveling wave may be analyzed. Referring to FIG. 1, for example, a first traveling wave arrives at $t_1$. After the arrival of the first traveling wave, a plurality of traveling waves arrive at $t_2$, $t_3$, $t_4$, and $t_5$.

Returning to a discussion of FIG. 6, at 608, a distortion associated with each of the plurality of subsequent traveling wave may be determined. The distortion associated with each of the plurality of traveling waves may be used to determine which of the plurality of subsequent traveling waves corresponds to a reflection of the first traveling wave from the fault. Each of the plurality of distortions may be compared to the first distortion to determine whether any of the plurality of distortions match the first distortion at 610. If a match is not detected, the compared wave is not considered to be the return of the first wave from the fault and a protective action may be restrained at 612. In various embodiments, each of the plurality traveling waves may be separately analyzed. For purposes of simplicity, method 600 analyzes the plurality of waves together at 606, 608, and 610.

Elements 606, 608, and 610 may be explained with reference to FIG. 1. A first distortion associated with the traveling wave that arrived at $t_1$ may be compared to the distortions associated with each of the traveling waves that arrived at $t_2$, $t_3$, $t_4$, and $t_5$. The traveling wave that arrived at $t_4$ is a reflection from the fault, and as such, the distortion of the traveling wave at $t_4$ will match the distortion of the traveling wave at $t_1$.

Returning to a discussion of FIG. 6, at 614, a distance to the fault may be determined based on the arrival time of the first traveling wave and the traveling wave with a matching distortion identified from among the plurality of traveling waves. In various embodiments, the determination of the distance to the fault may be made using Eq. 3. Further, in some embodiments, the distance to the fault may be expressed in a unit ratio of the distance to the fault to the length of the line using Eq. 4.

At 616, method 600 may determine whether the fault is within a reach setting based on the distance to the fault determined at 614. In various embodiments, the distance to the fault may be compared to a specific value (e.g., a value expressed in meters) or to a per unit value (e.g., a threshold representing a certain portion of the line) to determine if the fault is within a zone of protection. If the fault is outside of the zone of protection, protective action may be restrained at 612.

If the fault is within a reach setting based on the determination at 616, a protective action may be enabled at 618.

The protective action may be initiated based on the single measurement as described above, or for enhanced security, using multiple measurements. Referring to FIG. 1, the wave that arrived from behind the bus at $t_2$ will continue toward the fault and return back to the bus S. The method may identify that return as a reflection of the wave at $t_2$, and by doing so, may determine the distance to fault for a second time for the same fault. Similarly, the wave that arrived as a reflection from the remote bus at $t_3$ will reflect of the bus S, travel to the fault and return back. This reflection may allow a determination of the distance to the fault for a third time. In certain embodiments, the protective action may comprise actuating a breaker to de-energize a portion of an electric power system. In other embodiments, enabling a protective action at 618 may comprise a supervisory action. In one specific embodiment, a protective action may comprise asserting a signal, such as signal 206 in FIG. 2, that may be one condition necessary to assert output 212 of traveling wave distance element 200.

Figure 7:
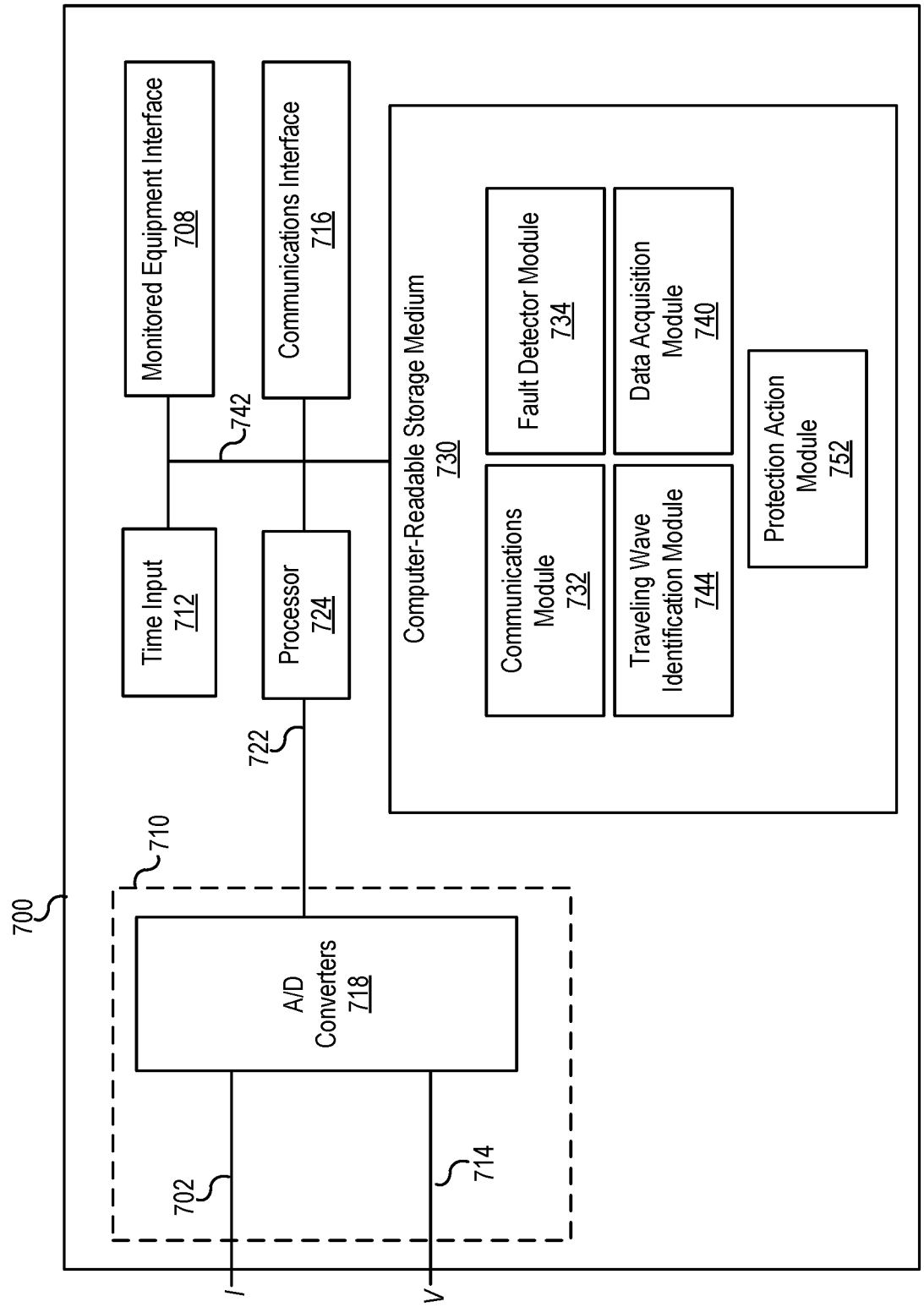
FIG. 7 illustrates a functional block diagram of a system for detecting and locating faults using distortions in traveling waves consistent with embodiments of the present disclosure.

FIG. 7 illustrates a functional block diagram of a system 700 for detecting and locating faults using distortions in traveling waves consistent with embodiments of the present disclosure. In certain embodiments, the system 700 may comprise an IED system to, among other things, obtain and calculate traveling wave signals and analyze distortions in traveling waves. Traveling waves may be measured by current transformers, which may be installed at the ends of transmission lines in substations. Current transformers typically have enough fidelity to measure current traveling waves with adequate accuracy for practical protection and fault locating applications. However, a current transformer measures the current at the point of its installation at the line terminal which is always a discontinuity in the characteristic impedance, and therefore it measures the sum of the incident and reflected current traveling waves. It does not measure the incident wave separately and it does not allow separating of the waves into incident, reflected, and transmitted waves.

The voltage and current traveling waves are linked with the characteristic impedance of the line, and according, may be separated into the incident, reflected and transmitted components. This separation may be performed using Eq. 6 for voltage traveling waves or Eq. 7 for current traveling waves.

$$v_{incident} = \frac{V_{TW} - i_{TW}Z_c}{2}$$
$$v_{reflected} = \frac{V_{TW} + i_{TW}Z_c}{2}$$

Eq. 6

$$i_{incident} = \frac{V_{TW}/Z_c - i_{TW}}{2}$$
$$i_{reflected} = \frac{V_{TW}/Z_c - i_{TW}}{2}$$

Eq. 7

Accurate measurements of both the total current traveling wave ($i_{TW}$) and the voltage traveling wave ($V_{TW}$) are needed to separate incident, reflected, and transmitted components. Current transformers may be used in some embodiments because they provide sufficiently accurate current traveling wave measurements. High-fidelity voltage measurements may be obtained in various embodiments using the systems and methods disclosed in U.S. patent application Ser. No. 16/137,186, titled HIGH-FIDELITY VOLTAGE MEASUREMENT USING A CAPACITANCE-COUPLED VOLTAGE TRANSFORMER, and filed on Sep. 20, 2018, which is incorporated herein by reference.

Wave separation into the incident, reflected, and transmitted traveling waves may allow better utilization of the traveling wave information as compared with using just traveling wave measurements from current transformers, which are the sums of the incident and reflected waves.

System 700 may be implemented using hardware, software, firmware, and/or any combination thereof. In some embodiments, system 700 may be embodied as an IED, while in other embodiments, certain components or functions described herein may be associated with other devices or performed by other devices. The specifically illustrated configuration is merely representative of one embodiment consistent with the present disclosure.

System 700 includes a communications interface 716 to communicate with devices and/or IEDs. In certain embodiments, the communications interface 716 may facilitate direct communication with other IEDs or communicate with systems over a communications network. System 700 may further include a time input 712, which may be used to receive a time signal (e.g., a common time reference) allowing system 700 to apply a time-stamp to the acquired samples. In certain embodiments, a common time reference may be received via communications interface 716, and accordingly, a separate time input may not be required for time-stamping and/or synchronization operations. One such embodiment may employ the IEEE 1588 protocol. A monitored equipment interface 708 may receive status information from, and issue control instructions to, a piece of monitored equipment (such as a circuit breaker, conductor, transformer, or the like).

Processor 724 processes communications received via communications interface 716, time input 712, and/or monitored equipment interface 708. Processor 724 may operate using any number of processing rates and architectures. Processor 724 may perform various algorithms and calculations described herein. Processor 724 may be embodied as a general-purpose integrated circuit, an application-specific integrated circuit, a field-programmable gate array, and/or any other suitable programmable logic device.

In certain embodiments, system 700 may include a sensor component 710. In the illustrated embodiment, sensor component 710 may receive high-fidelity current measurements 702 and/or high-fidelity voltage measurements 714. The sensor component 710 may use comprise A/D converters 718 that sample and/or digitize filtered waveforms to form corresponding digitized current and voltage signals provided to data bus 722. High-fidelity current measurements 702 and/or high-fidelity voltage measurements 714 may include separate signals from each phase of a three-phase electric power system. A/D converters 718 may be connected to processor 724 by way of data bus 722, through which digitized representations of current and voltage signals may be transmitted to processor 724.

A non-transitory computer-readable storage medium 730 may be the repository of various software modules that perform the methods, calculations, and determinations described herein. A data bus 742 may link monitored equipment interface 708, time input 712, communications interface 716, and computer-readable storage medium 730 to processor 724.

Communications module 732 may allow system 700 to communicate with any of a variety of external devices via communications interface 716. Communications module 732 may communicate using a variety of data communication protocols.

Data acquisition module 740 may collect data samples, such as current and voltage measurements associated with traveling waves. The data samples may be associated with a timestamp and made available for retrieval and/or transmission to a remote IED via communications interface 716. Traveling waves may be measured and recorded in real-time, since they are transient signals that dissipate rapidly in an electric power delivery system. Data acquisition module 740 may operate in conjunction with fault detector module 734. Data acquisition module 740 may control recording of data used by the fault detector module 734. According to one embodiment, data acquisition module 740 may selectively store and retrieve data and may make the data available for further processing. Such processing may include processing by fault detector module 734, which may identify distortions in traveling waves.

Traveling wave identification module 744 may compare distortions of traveling waves. As described and illustrated herein, traveling wave distortions may be used to determine the origin or reflection of traveling waves. Traveling waves with similar distortions may be determined to have similar origins or reflections. Traveling wave identification module 744 may identify traveling waves based on detected distortions. The fault detector module 734 may determine a fault according to several traveling wave protection algorithms using the identifications of the traveling waves according to several embodiments herein.

A protective action module 752 may implement a protective action based on a declaration of a fault by the fault detector module 734. In various embodiments, a protective action may include tripping a breaker, selectively isolating a portion of the electric power system, etc. In various embodiments, the protective action module 752 may coordinate protective actions with other devices in communication with system 700.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to analyze traveling waves in an electric power delivery system, comprising:
    a traveling wave identification subsystem to:
        receive a plurality of electric power system signals;
        identify a plurality of incident, reflected, and transmitted traveling waves from the plurality of electric power system signals;
        select a first traveling wave from the identified plurality of incident and transmitted traveling waves propagating in a direction of the electric power delivery system;
        determine a first distortion of the first traveling wave;
        select a second traveling wave subsequent to the first traveling wave, the second traveling wave selected from the identified plurality of incident traveling waves; and
        determine a second distortion of the second traveling wave;
    a traveling wave analysis subsystem in communication with the traveling wave identification subsystem to:
        compare the first distortion and the second distortion; and
        determine whether the first distortion is consistent with the second distortion and
    a protective action subsystem in communication with the traveling wave analysis subsystem to implement a protective action based on a first determination that the first distortion is consistent with the second distortion.

2. The system of claim 1, wherein the first distortion and the second distortion comprise a representation of electrical parameters of an electrical bus and connected power equipment in the electric power delivery system.

3. The system of claim 1, wherein the traveling wave analysis subsystem is further configured to determine a distance to a fault based at least in part on a first arrival time of the first traveling wave and a second arrival time of the second traveling wave.

4. The system of claim 1, wherein the protective action comprises actuation of a circuit breaker to de-energize a portion of the electric power system comprising a location where the traveling wave originated.

5. The system of claim 1, wherein the electric power delivery system signals comprise high-bandwidth voltage signals.

6. The system of claim 1, wherein the protective action comprises enabling an output of a distance protection element.

7. The system of claim 1, wherein the protective action subsystem restrains the protective action when the first distortion is inconsistent with the second distortion.

8. The system of claim 3, wherein the protective action subsystem determines whether the fault is within a reach setting based on the distance to the fault.

9. The system of claim 3, wherein the protective action subsystem determines whether the fault is within a reach setting based on the distance to the fault.

10. The system of claim 5, further comprising a data acquisition subsystem to acquire the plurality of electric power delivery system signals at a terminal of the electric power delivery system.

11. The system of claim 10, wherein implementation of the protective action is based exclusively on information gathered exclusive from one terminal on the electric power delivery system.

12. A method for analyzing traveling waves in an electric power delivery system, comprising:
    receiving a plurality of electric power system signals at an intelligent electronic device (IED);
    the IED identifying a plurality of incident, reflected, and transmitted traveling waves from the plurality of electric power system signals;
    selecting a first traveling wave from the identified plurality of incident and transmitted traveling waves propagating in a direction of the electric power delivery system;
    determining a first distortion of the first traveling wave;
    selecting a second traveling wave subsequent to the first traveling wave, the second traveling wave selected from the identified plurality of incident traveling waves;
    determining a second distortion of the second traveling wave;
    comparing the first distortion and the second distortion;
    determining whether the first distortion is consistent with the second distortion; and
    implementing a protective action based on a first determination that the first distortion is consistent with the second distortion.

13. The method of claim 12, wherein the first distortion and the second distortion comprise a representation of electrical parameters of an electrical bus and connected power equipment in the electric power delivery system.

14. The method of claim 12, further comprising determining a distance to a fault based at least in part on a first arrival time of the first traveling wave and a second arrival time of the second traveling wave.

15. The method of claim 12, wherein the protective action comprises actuating a circuit breaker to de-energize a portion of the electric power system comprising a location where the traveling wave originated.

16. The method of claim 12, wherein the electric power delivery system signals comprise high-bandwidth voltage signals.

17. The method of claim 12, wherein the protective action comprises enabling an output of a distance protection element.

18. The method of claim 12, further comprises restraining the protective action when the first distortion is inconsistent with the second distortion.

19. The method of claim 16, further comprising acquiring the plurality electric power delivery system signals at a terminal of the electric power delivery system.

20. A system to analyze traveling waves in an electric power delivery system, comprising:
a processor;
a non-transitory computer-readable medium comprising instructions that when executed by the processor cause the processor to implement operations for:
receiving a plurality of electric power system signals;
identifying a plurality of incident, reflected, and transmitted traveling waves from the plurality of electric power system signals;
selecting a first traveling wave from the identified plurality of incident and transmitted traveling waves propagating in a direction of the electric power delivery system;
determining a first distortion of the first traveling wave;
selecting a second traveling wave subsequent to the first traveling wave, the second traveling wave selected from the identified plurality of incident traveling waves;
determining a second distortion of the second traveling wave;
comparing the first distortion and the second distortion;
determining whether the first distortion is consistent with the second distortion; and
implementing a protective action based on a first determination that the first distortion is consistent with the second distortion.

* * * * *